(12) United States Patent
Stegmüller (10) Patent No.: US 6,917,055 B2
(45) Date of Patent: Jul. 12, 2005

(54) OPTOELECTRONIC COMPONENT AND METHOD FOR PRODUCING AN OPTOELECTRONIC COMPONENT

(75) Inventor: Bernhard Stegmüller, Augsburg (DE)

(73) Assignee: Infineon Technologies AG, Munich (DE)

( * ) Notice: Subject to any disclaimer, the term of this patent is extended or adjusted under 35 U.S.C. 154(b) by 101 days.

(21) Appl. No.: 10/339,232

(22) Filed: Jan. 9, 2003

(65) Prior Publication Data

US 2003/0218119 A1 Nov. 27, 2003

(30) Foreign Application Priority Data

Jan. 9, 2002 (DE) .......................................... 102 01 126

(51) Int. Cl.$^7$ .............................................. H01L 31/12
(52) U.S. Cl. ............................. 257/85; 257/14; 257/21; 257/84
(58) Field of Search ......................... 257/14, 21, 84–85

(56) References Cited

U.S. PATENT DOCUMENTS

| | | | | | |
|---|---|---|---|---|---|
| 4,653,058 | A | * | 3/1987 | Akiba et al. .................. | 372/50 |
| 5,105,433 | A | | 4/1992 | Eisele et al. | |
| 5,283,447 | A | * | 2/1994 | Olbright et al. ............... | 257/85 |
| 5,361,273 | A | * | 11/1994 | Kosaka ......................... | 372/50 |
| 5,485,014 | A | * | 1/1996 | Jain et al. ...................... | 257/21 |
| 5,659,646 | A | | 8/1997 | Vinchant et al. | |
| 5,714,765 | A | | 2/1998 | Noetzel et al. | |
| 5,917,636 | A | * | 6/1999 | Wake et al. .................. | 398/182 |
| 6,001,664 | A | * | 12/1999 | Swirhun et al. .............. | 438/31 |
| 6,066,859 | A | * | 5/2000 | Stegmueller .................. | 257/21 |
| 6,253,009 | B1 | | 6/2001 | Lestra et al. | |
| 6,711,200 | B1 | * | 3/2004 | Scherer et al. ................ | 372/64 |

FOREIGN PATENT DOCUMENTS

| | | |
|---|---|---|
| DE | 39 31 588 A1 | 4/1991 |
| DE | 0 665 450 B1 | 8/1995 |
| DE | 196 52 529 A1 | 6/1998 |
| EP | 1 005 120 A1 | 5/2000 |
| GB | 2 120 457 A | 11/1983 |

OTHER PUBLICATIONS

Y. Suzaki et al.: "Novel 1.3 μm MQW light–emission–and–detection diode with flat responsivity characteristics", *Electronics Letters*, vol. 31, No. 16, Aug. 3, 1995, pp. 1388–1389.

U. Koren et al.: " A 1.3 μm Wavelength Laser with an Integrated Output Power Monitor Using a Directional Coupler Optical Power Tap", *IEEE Photonics Technology Letters*, vol. 8, No. 3, Mar. 1996, pp. 364–366.

* cited by examiner

*Primary Examiner*—Allan R. Wilson
(74) *Attorney, Agent, or Firm*—Laurence A. Greenberg; Werner H. Stemer; Ralph E. Locher (57) ABSTRACT

An optoelectronic component has at least one light source which is monolithically integrated in a semiconductor material, in particular having a laser diode. At least one photodetector for measuring the light output power is coupled to the light source via an active layer of the light source. At least one active layer or a modulator layer has a multiple quantum well structure formed with at least two quantum well types and/or a quantum dot structure. In the production method the active layer for the light source is first grown on a substrate and a photodetector structure is then grown on the active layer for the light source. The novel optoelectronic component is very compact and can be regulated efficiently.

17 Claims, 5 Drawing Sheets

OPTOELECTRONIC COMPONENT AND METHOD FOR PRODUCING AN OPTOELECTRONIC COMPONENT

BACKGROUND OF THE INVENTION

Field of the Invention

The invention relates to an optoelectronic component having at least one light source which is monolithically integrated in a semiconductor material. In particular, the optoelectronic device has a laser diode. The invention also pertains to a method of producing such an optoelectronic component.

In telecommunications, in particular, the problem exists of operating ever smaller optoelectronic components at ever higher frequencies in order to increase the data transmission rates. The optical light power of a light source, in particular of a laser diode, is a significant parameter in this case. The light power must be regulated as exactly, simply and directly as possible for optimum operation. Both the knowledge of the optical power at a specific location in the optoelectronic component and the optical light power output by the latter at a specific location, e.g. to an optical waveguide (e.g. optical fiber), may be of interest in this case.

The publication by U. Koren et al. "A 1.3 µm Wavelength Laser with an Integrated Output Power Monitor Using a Directional Coupler Optical Power Tap", IEEE Photonics Technology Letters, Vol. 8, No. 3, March 1996, pp. 364–366, discloses branching off part of the optical light power e.g. by means of an optical coupling unit. The emitted light power of the laser diode is measured at the second coupling-out window of the optical resonator, a calibration measurement being used to produce a relationship with the light power of interest at the first coupling-out window. What is disadvantageous in this case is that this measurement is indirect and complicated.

Although combined light-emission-and-detection diodes (LEAD) are also known (Suzaki et al. "Novel 1.3 µm MQW light-emission-and-detection diode with flat responsivity characteristics", Electron. Lett. Vol. 31, No. 16, Aug. 3, 1995, pp. 1388–89), these are not suitable for the regulation of monolithic integrated laser diodes themselves.

SUMMARY OF THE INVENTION

It is accordingly an object of the invention to provide an optoelectronic component which overcomes the above-mentioned disadvantages of the heretofore-known devices and methods of this general type and which is compact and can be regulated efficiently, as well as a method for the simple production of said device.

With the foregoing and other objects in view there is provided, in accordance with the invention, an optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer; and at least one of said active layer and a modulator layer having a multiple quantum well structure formed with a quantum structure selected from the group consisting of at least two quantum well types and a quantum dot structure.

In a preferred embodiment, the light source is an integrated laser diode.

By virtue of the fact that at least one photodetector in the semiconductor material is coupled to at least one light source via a common active layer of the at least one light source, the measurement of the optical light power can be measured directly in the active layer. In this case at least one active layer or a modulator layer has a multiple quantum well structure comprising at least two quantum well types and/or a quantum dot structure. This permits a simple measurement and efficient measurement.

It is advantageous if a measurement signal from the photodetector is transmitted to a control device for regulating the light power of the optoelectronic component. The operation of the optoelectronic component can thus be regulated in a particularly simple manner. It is particularly advantageous if the measurement signal is tapped off at a predetermined location in the device and/or at a transition from the device to an optical waveguide, in particular an optical fiber. In the first case, the light power is determined in the device itself and, in the second case, the output light power is detected. Both cases are of practical importance individually or in combination.

It is also advantageous if the light source is designed as a laser diode with a DFB structure, a DBR structure or a two-dimensional photonic crystal structure. Narrowband laser light can thus be generated.

For efficient setting of the light intensity, it is advantageous if one embodiment of the device according to the invention has at least one electro-optical modulator, in particular an electroabsorption modulator.

The photodetector is advantageously arranged at the coupling-out window of the electroabsorption modulator in order that the time-dependent light power behavior can be detected.

In this case, it is advantageous if the cross section of the photodetector widens continuously or discontinuously downstream of the electroabsorption modulator in the direction of the light propagation direction. By virtue of such a taper structure, it is possible to improve the optical coupling to another waveguide and it is possible to reduce optical back reflections into the waveguide of the device.

In accordance with an advantageous refinement of the invention, the device has at least one optical amplifier.

For the strong optical and/or electrical decoupling of at least two components, it is advantageous if at least one trench is introduced into the semiconductor material between the at least two components.

For a weak optical and a strong electrical decoupling of at least two components, it is advantageous if at least one trench is introduced into the semiconductor material between the components, said at least one trench having implanted ions.

In an advantageous manner, for the strong optical and electrical decoupling of at least two components, at least one Bragg structure or a two-dimensional photonic crystal structure is arranged in the semiconductor material.

With the above and other objects in view there is also provided, in accordance with the invention, a method of producing an optoelectronic component as outlined above. The method comprises the steps of growing the active layer for the light source on a substrate, and subsequently growing a photodetector structure on the active layer for the light source.

That is, at least one active layer is grown on a substrate, a photodetector structure subsequently being grown on, the active layer also being the active layer of an integrated light source.

Other features which are considered as characteristic for the invention are set forth in the appended claims.

Although the invention is illustrated and described herein as embodied in an optoelectronic component and method for producing it, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
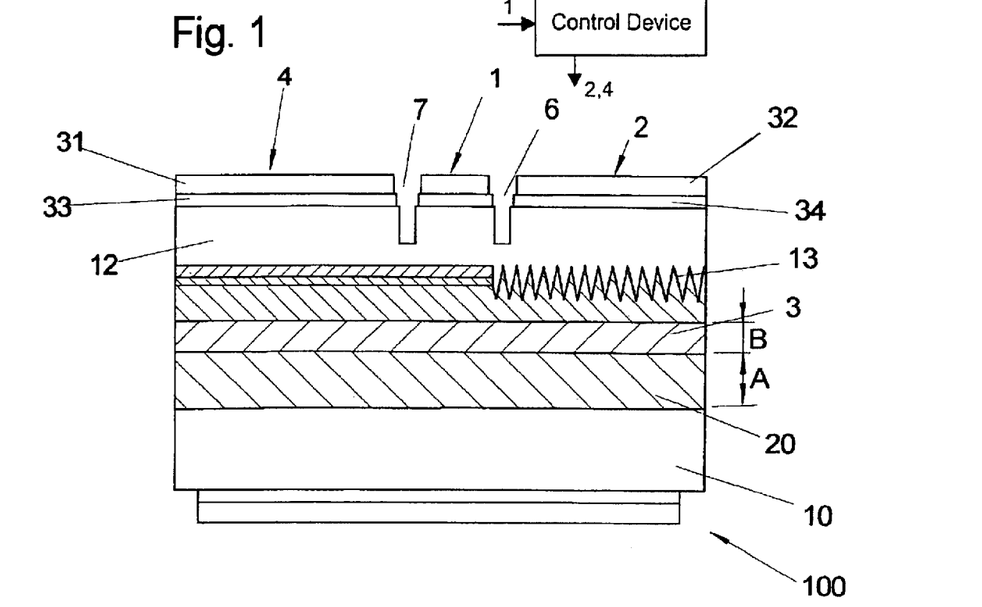
FIG. 1 is a diagrammatic sectional view of a first embodiment of an optoelectronic component according to the invention.

Referring now to the figures of the drawing in detail and first, particularly, to FIG. 1 thereof, there is shown a section through a first embodiment of an optoelectronic component 100 according to the invention. The first embodiment has as its components, viewed from right to left, a laser diode 2, forming the light source, a photodetector 1 and an electroabsorption modulator 4 (EAM). All three components 1, 2, 4 are monolithically integrated in a semiconductor material.

In the text below, the horizontal sequence of the components 1, 2, 4 is illustrated first, and then the vertical layer sequence.

The region of the laser diode 2 is illustrated on the right in FIG. 1. In this case, the laser diode 2 is designed as a DFB laser (DFB, distributed feedback) with a Bragg grating 13 in a manner known per se. In this case, the Bragg grating 13 is arranged only in the region of the laser diode 2. In this case, the Bragg grating 13 need not extend over the entire length of the laser diode 2. A DBR laser structure (DBR, distributed Bragg reflector) can also be used in an alternative embodiment.

The laser diode 2 is followed, to the left, by the photodetector 1. A first trench 6 is formed in the semiconductor material between the region of the laser diode 2 and the photodetector 1.

An electroabsorption modulator 4 is arranged on the left beside the photodetector 1 in FIG. 1. The electroabsorption modulator 4 makes it possible to influence the band structure of the semiconductor by changing the electrical field, so that the intensity of the laser light of the laser diode 2 can be controlled. Very high-frequency data transmissions are possible by way of this modulation.

A second trench 7 is formed between the electroabsorption modulator 2 and the photodetector 1.

The optoelectronic component 100 is constructed from layers in the vertical direction. In this case, the layers are deposited epitaxially in a customary manner and patterned e.g. by etching.

A multiple quantum well layer (MQW layer) forms a modulator layer 20, which is provided for the electroabsorption modulator 4. The MQW layer 20 is grown on n-doped, epitaxially grown layers 10 forming a substrate. A thickness A of the modulator layer 20 is between 0 and 500 nm.

An active layer 3 (likewise an MQW structure) is disposed as active layer for the laser diode 2. The active layer has a thickness B of approximately 0 to 500 nm.

The following holds true for the ratio of the layer thicknesses:

$$0 > \frac{B}{A+B} \geq 1$$

The minimum value corresponds to a relatively thick modulator layer 20 compared with the active layer 3, and the maximum value 1 corresponds to an exclusively active layer 3. These details can be applied mutatis mutandis to all the further exemplary embodiments.

In the case of this first embodiment, in contrast with the prior art integrated structures, the components 1, 2, 4 of the optoelectronic component 100 are functionally coupled via at least one common active layer 3. In particular, the photo detector 1 is coupled to the laser diode 2 via the active layer 3.

In the present example there are two layers, namely the modulator layer 20 and the active layer 3, which have an MQW structure. These MQW structures are composed of different quantum well types. In principle, quantum dot structures can also be used instead of the MQW structures or in combination with MQW structures. For more information concerning quantum well and quantum dot structures and other related information, see my copending, concurrently filed application Ser. Nos. 10/339,243, 10/339,244, and 10/339,242, the disclosures of which are herewith incorporated by reference.

The active layer 3 and the modulator layer 20 can be produced in an epitaxy process. A significant simplification is thus achieved in production.

Arranged above the active layer 3 are p-doped layers 12. The optoelectronic component 100 has contact layers 33, 34 and contacts 31, 32. The contact layers 33, 34 are formed from highly doped semiconductor material which is conductively connected to metallic contacts. Each component 1, 2, 4 can thus be supplied with current injections in a targeted manner.

By virtue of the coupling of the laser diode 2 and the photo detector 1 via the active layer 3, the light in the optoelectronic component can be measured efficiently by way of the photo detector. The measurement signal obtained can then be communicated to a control device for regulating the laser diode 2. The control device and driver is schematically indicated at the top of FIG. 1.

The first embodiment has a strong optical and strong electrical decoupling of the components 1, 2, 4 on account of the trenches 6, 7, so that the components can be controlled individually in a simple manner.

As an alternative it is possible to achieve an increased electrical insulation by means of an ion implantation in the trenches 6, 7, which results in a weak optical but a strong electrical decoupling. As an alternative, the trenches 6, 7 or the ion-implanted regions can also reach further into the depth of the semiconductor material, in particular as far as the n-doped layers 10.

Figure 2:
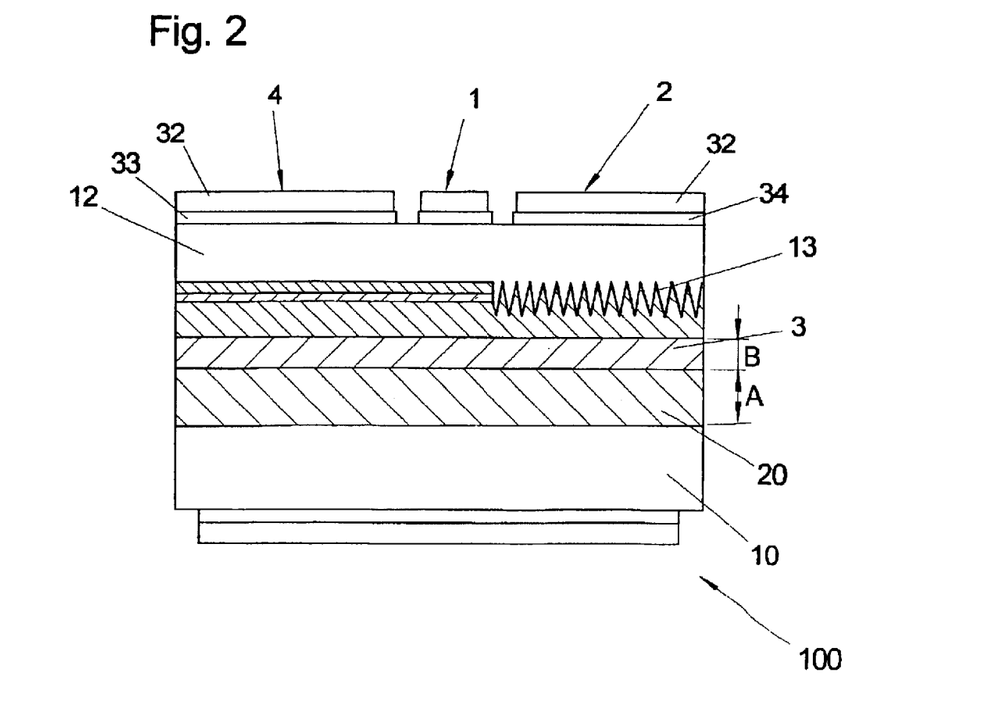
FIG. 2 is a diagrammatic sectional view of a second embodiment of an optoelectronic component according to the invention.

The same construction of an optoelectronic component is described, in principle, in FIG. 2, so that reference is made to the explanations above.

In contrast to the first embodiment, the components 1, 2, 4 are not isolated by trenches 6, 7 in the second embodiment, so that a weak optical and a weak electrical decoupling is present. This may be advantageous precisely for fast switching operations.

Figure 3:
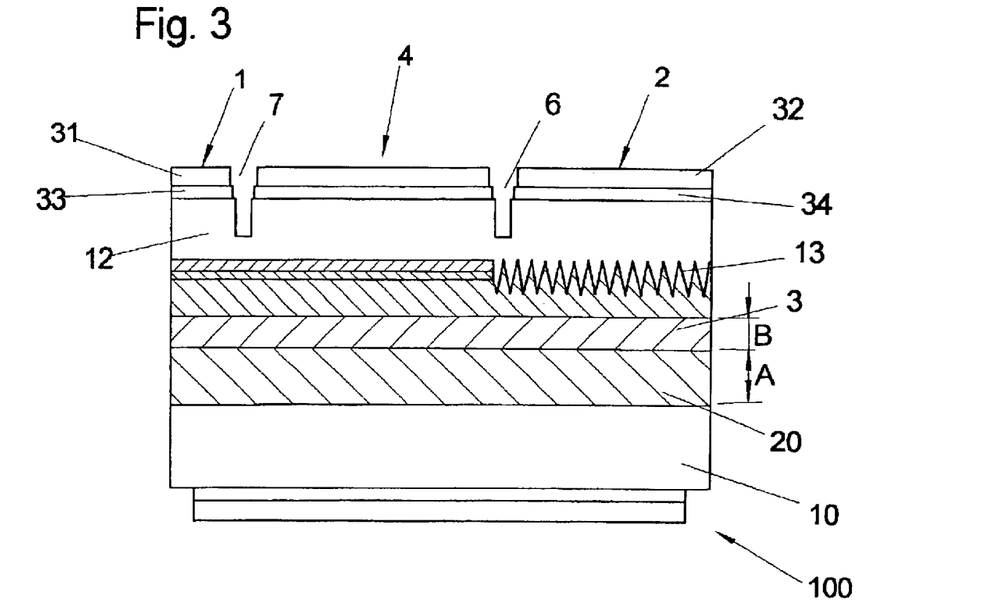
FIG. 3 is a diagrammatic sectional view of a third embodiment of an optoelectronic component according to the invention.
Figure 4:
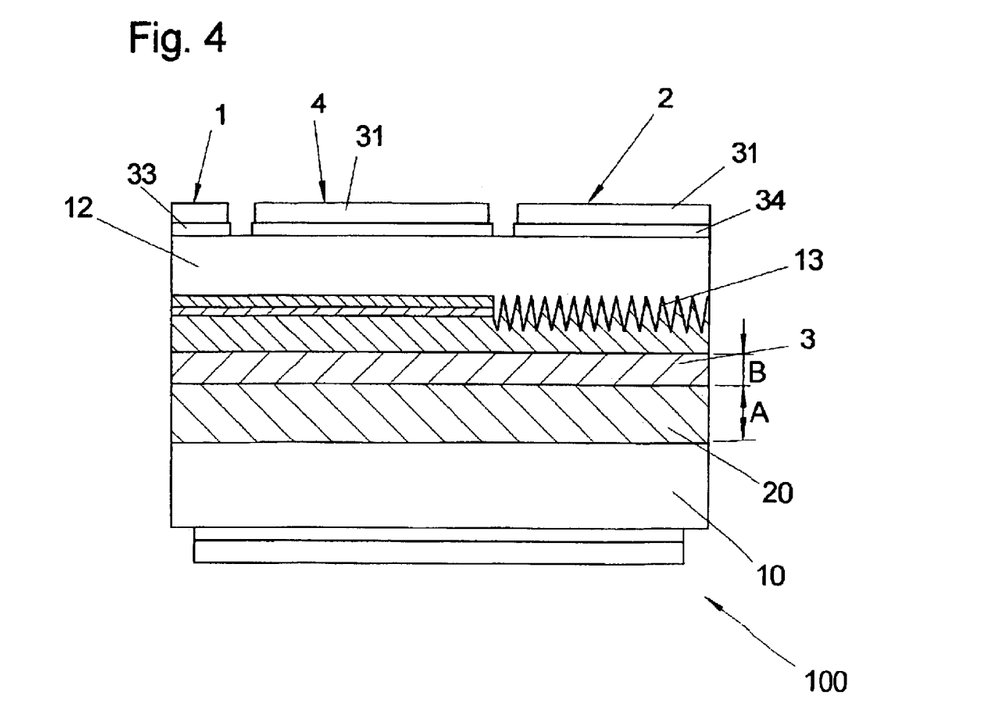
FIG. 4 is a diagrammatic sectional view of a fourth embodiment of an optoelectronic component according to the invention.

While the measurement of the light power within the optoelectronic component comes to the fore in the case of the first and second embodiments, the time-dependent profile of the optical signal downstream of the electroabsorption modulator 4 is also detected in the case of the third and fourth embodiments (FIGS. 3 and 4).

The third embodiment, which is illustrated in FIG. 3, is similar to the first embodiment since, in this case, too, trenches 6, 7 are arranged between the components 1, 2, 4. However, in this-case the photodetector 1 is arranged on the left beside the electroabsorption modulator 4, so that the behavior of the electroabsorption modulator 4 is also detected in addition to the light power.

The fourth embodiment in accordance with FIG. 4 is similar to the third embodiment (FIG. 3) in terms of the order of the components 1, 2, 4. Since the components 1, 2, 4 are not isolated by trenches 6, 7, however, a configuration as in the second embodiment is also analogously present. Consequently, reference may be made to the descriptions above.

Figure 5:
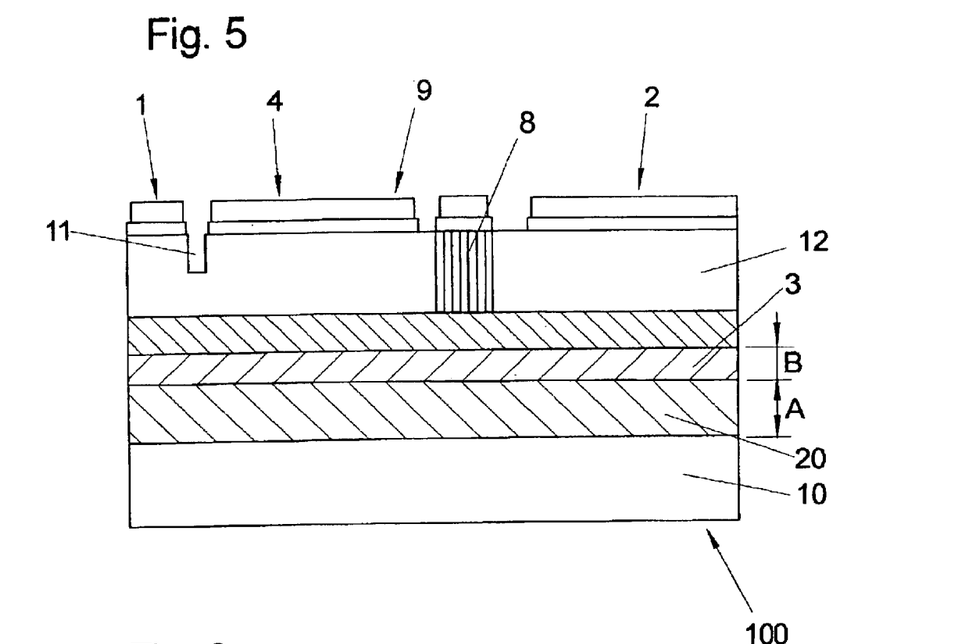
FIG. 5 is a diagrammatic sectional view of a fifth embodiment of an optoelectronic component according to the invention.

The fourth embodiment is modified in a fifth embodiment, which is illustrated in FIG. 5. A second photo detector 9 on a Bragg structure 8 is arranged as further component between the laser diode 2 and the electroabsorption modulator 4.

The Bragg structure 8 has a width of between 2 and 50 $\mu$m. The individual vertical layers of the Bragg structure 8 have a minimum width of less than 1 $\mu$m, at most of a few micrometers, in accordance with the operating wavelength.

The Bragg structure 8 provides for a strong optical and electrical decoupling e.g. of the laser diode 2 with other components and in the longitudinal direction. The Bragg structure 8 also ensures a definition of the laser resonator and of the emission wavelength. As an alternative, the Bragg structure 8 can also be arranged between other components 1, 2, 4, 9.

Moreover, the fifth embodiment has a third trench 11 arranged between the electroabsorption modulator 4 and the photo detector 1. The third trench 11 has a width of less than 10 $\mu$m.

The length of the electroabsorption modulator 4 is between 20 and 300 $\mu$m, and the length of the photo detector 1 is from 2 to 50 $\mu$m. These values may essentially be applied to the other exemplary embodiments as well.

Figure 6:
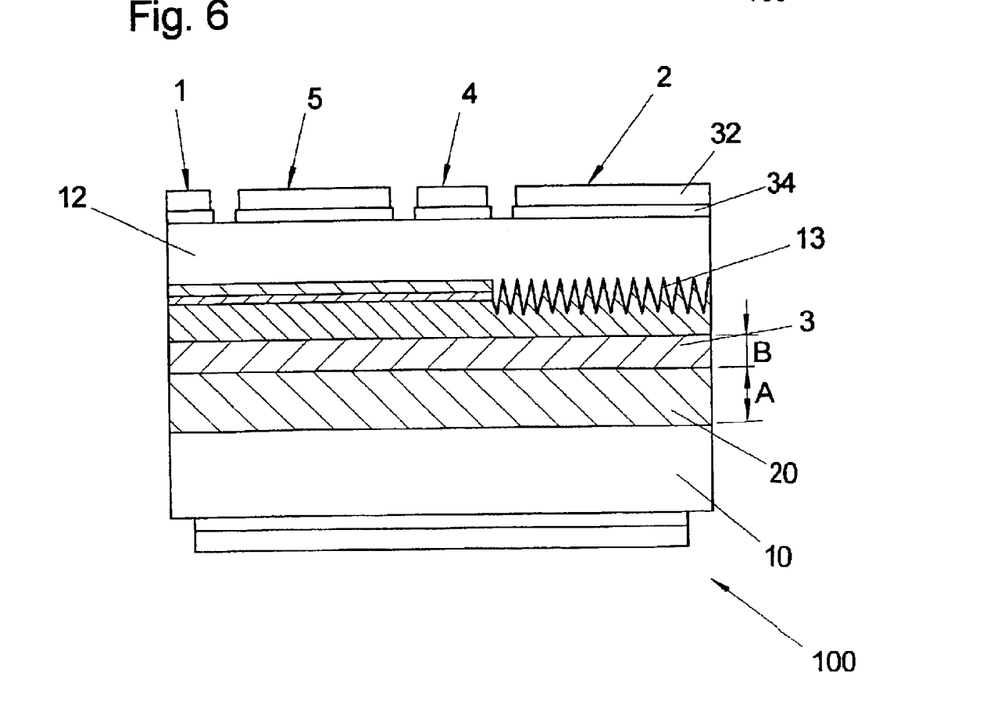
FIG. 6 is a diagrammatic sectional view of a sixth embodiment of an optoelectronic component according to the invention.

FIG. 6 illustrates a sixth embodiment, which represents a modification of the third embodiment. In this case, an optical amplifier 5 having a length of between 50 and 1000 $\mu$m is arranged between the electroabsorption modulator 4 and the photo detector 1.

Different embodiments of an optoelectronic component according to the invention are illustrated in FIGS. 1 to 6. In this case, the optoelectronic components have different, monolithically integrated components 1, 2, 4, 5, 9 such as e.g. laser diodes, electroabsorption modulators, photodetectors or optical amplifiers. The combination of these components 1, 2, 4, 5, 9 in the exemplary embodiments is by way of example, so that other combinations of the components 1, 2, 4, 5, 9 are also possible.

Moreover, the optoelectronic component according to the invention can be constructed from any semiconductor material with so-called direct state transitions (such as e.g. III–V, II–IV material) which can be used for the individual components 1, 2, 4, 5, 9 (e.g. InGaASP or InGaAlAS).

Figure 7A:
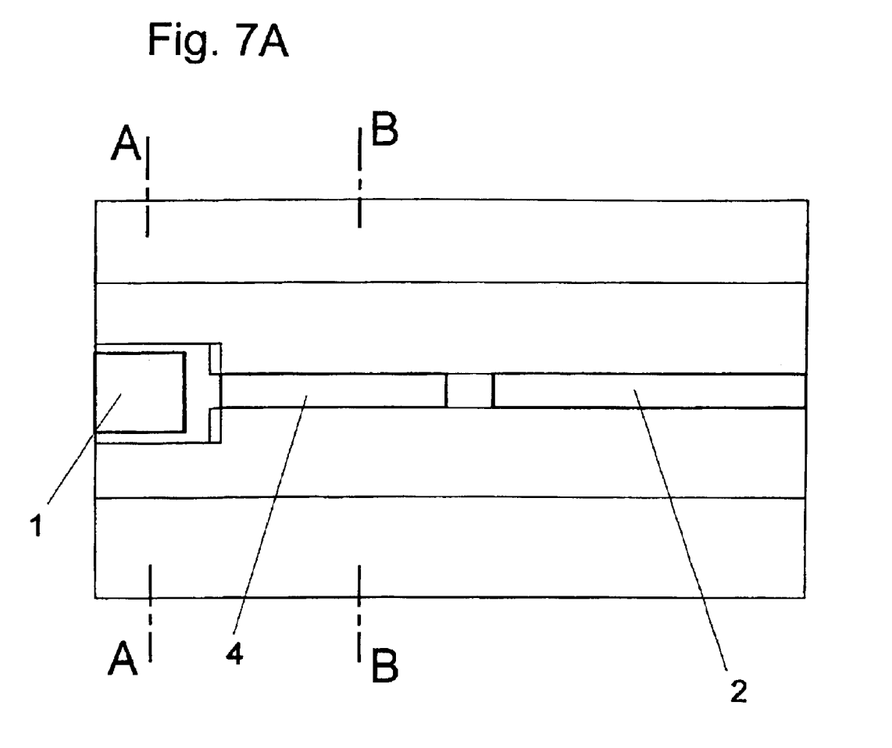
FIG. 7A is a diagrammatic plan view onto the fourth embodiment of the optoelectronic component according to the invention with a first variant of the optical waveguide.
Figure 7B:
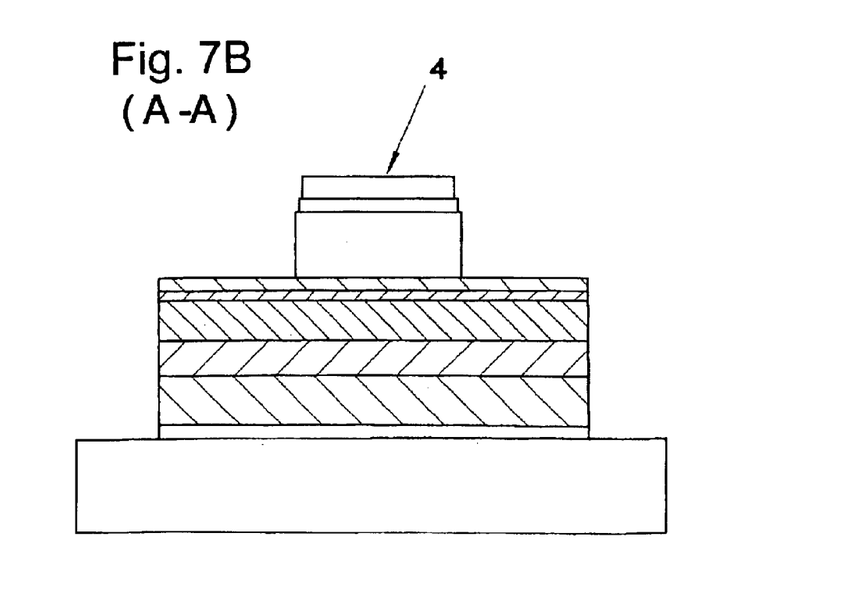
FIG. 7B is a section taken along the line A—A in FIG. 7A.
Figure 7C:
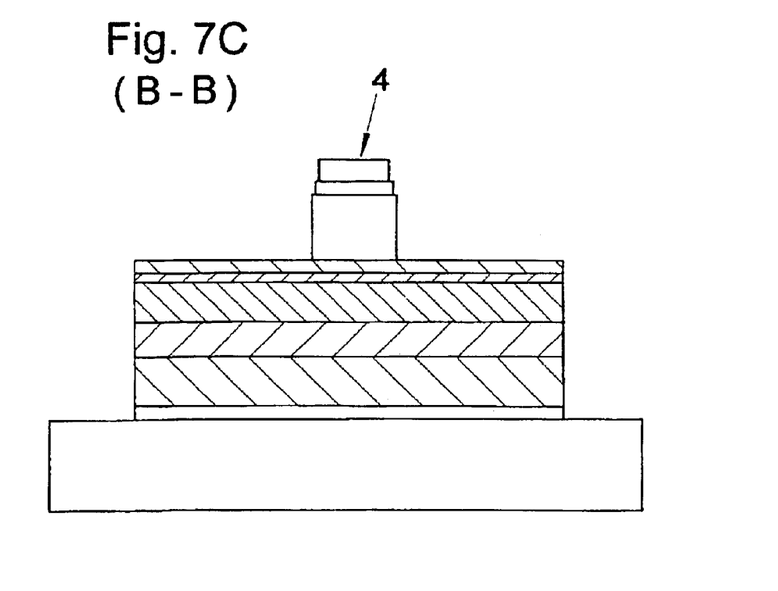
FIG. 7C is a section taken along the line B—B in FIG. 7A.
Figure 7D:
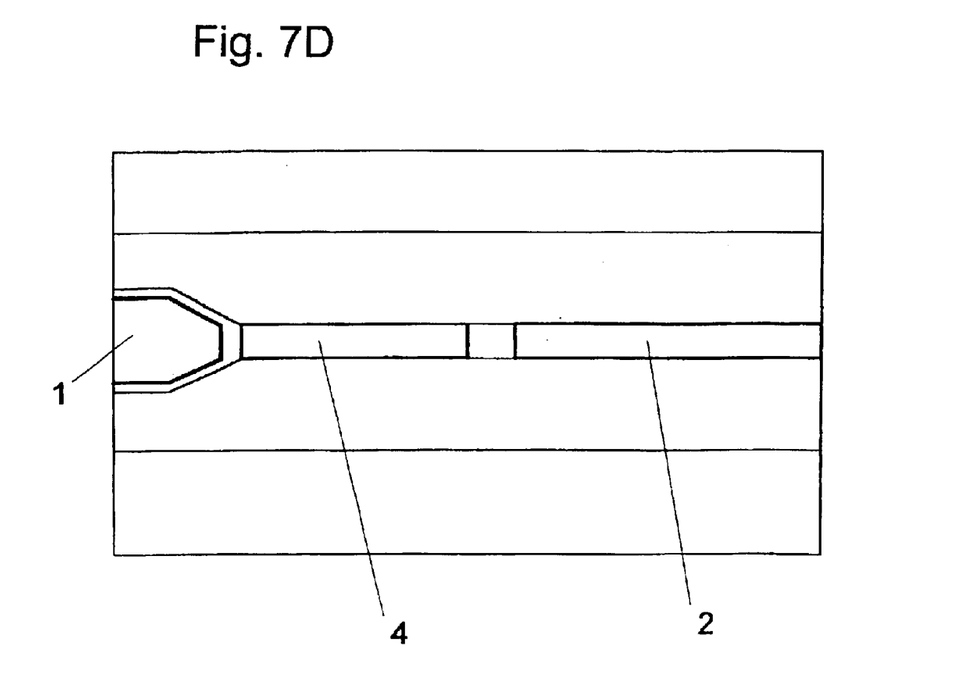
FIG. 7D is a diagrammatic plan view onto the fourth embodiment of the optoelectronic component according to the invention with a second variant of the optical waveguide.

On the basis of the fourth embodiment, FIGS. 7A and 7D illustrate different variants of the structuring of the photo diode 1, which can also be applied analogously to the other embodiments of the optoelectronic component according to the invention.

FIG. 7A illustrates a plan view of the optoelectronic component in accordance with FIG. 4. A laser diode 2, an electroabsorption modulator 4 and a photo detector 1 are arranged from right to left. For the more detailed description, reference is made to the explanations above.

In this case, in a first variant, the cross section of the optical waveguide with the photo detector 1 is enlarged discontinuously relative to the cross section of the optical waveguide with the electroabsorption modulator 4. What is thus achieved is that the reflection properties of the coupling-out area of the optical waveguide can be altered better and more simply.

The reflection is thus reduced in the direction of the electroabsorption modulator 4 and the laser diode 2.

FIGS. 7B and 7C show sectional views at the locations identified by A—A and B—B, respectively. In this case, FIG. 7B shows the widened part of the optical waveguide, and FIG. 7C shows the narrow part.

FIG. 7D shows a second variant of the configuration of the optical waveguide. In this case, the cross section of the photo detector 1 widens in a linearly continuous manner in the light propagation direction. In principle, other continuous cross-sectional geometries are also conceivable.

It will be understood that the embodiment of the invention is not restricted to the preferred exemplary embodiments specified above. Rather, a number of variants are conceivable which make use of the optoelectronic component according to the invention and the method for producing it in the case of embodiments of fundamentally different configuration, as well.

I claim:

1. An optoelectronic component, comprising:
   at least one light source monolithically integrated in a semiconductor material, said light source having an active layer;
   at least one photodetector for measuring light power, said photodetector having at least one active layer in common with said active layer of said light source, and said photodetector being coupled with said at least one light source via said at least one active layer;

at least one of said active layer and a modulator layer having a multiple quantum well structure formed with a quantum structure selected from the group consisting of at least two quantum well types and a quantum dot structure; and at least one electro-optical modulator for modulating said light source, said electro-optical modulator being an electroabsorption modulator, said electroabsorption modulator having a coupling-out window and said photodetector being disposed at said coupling-out window.

2. The optoelectronic component according to claim 1, wherein said light source is a laser diode.

3. The optoelectronic component according to claim 1, wherein said photodetector is configured to output a measurement signal to be transmitted to a control device for regulating the light power of the optoelectronic component.

4. The optoelectronic component according to claim 1, which further comprises a control device for controlling a light power output of said light source, said control device having an input connected to receive a measurement signal from said photodetector.

5. The optoelectronic component according to claim 3, wherein the measurement signal is output at a predetermined location.

6. The optoelectronic component according to claim 3, wherein the measurement signal is output at a transition from the component to an optical waveguide.

7. The optoelectronic component according to claim 3, which comprises an optical fiber connecting said photodetector with said control device.

8. The optoelectronic component according to claim 1, wherein said light source is a laser diode with a DFB structure.

9. The optoelectronic component according to claim 1, wherein said light source is a laser diode with a DBR structure.

10. The optoelectronic component according to claim 1, wherein said light source is a laser diode with a two-dimensional photonic crystal structure.

11. The optoelectronic component according to claim 1, which comprises at least one optical amplifier commonly integrated with said light source and said photodetector.

12. A method of producing an optoelectronic component, which comprises producing an optoelectronic component according to claim 1 and thereby growing the active layer for the light source on a substrate, and subsequently growing a photodetector structure on the active layer for the light source.

13. An optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer;

at least one of said active layer and a modulator layer having a multiple quantum well structure formed with a quantum structure selected from the group consisting of at least two quantum well types and a quantum dot structure;

at least one electro-optical modulator for modulating said light source, said electro-optical modulator being an electroabsorption modulator; and a cross section of said photodetector widening continuously or discontinuously downstream of said electroabsorption modulator in a light propagation direction.

14. An optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer, said light source and said photodetector being commonly integrated in the semiconductor material;

at least one of said active layer and a modulator layer having a multiple quantum well structure formed with a quantum structure selected from the group consisting of at least two quantum well types and a quantum dot structure; and a trench formed in the semiconductor material between said light source and said photodetector for one of optical and electrical decoupling of said light source from said photodetector.

15. An optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer;

at least one of said active layer and a modulator layer having a multiple quantum well structure formed with a quantum structure selected from the group consisting of at least two quantum well types and a quantum dot structure;

at least one electro-optical modulator for modulating said light source;

said light source, said photodetector, and said electro-optical modulator forming a group of components commonly integrated in the semiconductor material; and a trench formed in the semiconductor material between at least two of said components for one of optical and electrical decoupling of said components.

16. An optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer;

at least one of said active layer and a modulator layer having a multiple quantum well structure formed with a quantum structure selected from the group consisting of at least two quantum well types and a quantum dot structure;

at least one electro-optical modulator for modulating said light source;

said light source, said photodetector, and said electro-optical modulator forming a group of components commonly integrated in the semiconductor material; and the semiconductor material being formed with at least one trench between at least two of said components for relatively weak optical and relatively strong electrical decoupling of said components, said at least one trench containing implanted ions.

17. An optoelectronic component, comprising:

at least one light source monolithically integrated in a semiconductor material, said light source having an active layer;

at least one photodetector for measuring light power, said photodetector having at least one active layer in common with said active layer of said light source, and said photodetector being coupled with said at least one light source via said at least one active layer;

at least one of said active layer and a modulator layer having a multiple quantum well structure formed with a quantum structure selected from the group consisting of at least two quantum well types and a quantum dot structure; and the semiconductor material being formed with a structure for strong optical and electrical decoupling of at least two components, the structure being selected from the group consisting of a Bragg structure and a two-dimensional photonic crystal structure.

* * * * *